(12) United States Patent
Wang et al.

(10) Patent No.: US 8,895,935 B2
(45) Date of Patent: Nov. 25, 2014

(54) HIGH EFFICIENCY SECONDARY AND BACK SCATTERED ELECTRON DETECTOR

(75) Inventors: Zhibin Wang, Beijing (CN); Wei He, Beijing (CN); Qingpo Xi, Beijing (CN); Shuai Li, Beijing (CN); Fumin He, Beijing (CN)

(73) Assignee: Hermes Microvision, Inc., Hsinchu (TW)

( * ) Notice: Subject to any disclaimer, the term of this patent is extended or adjusted under 35 U.S.C. 154(b) by 218 days.

(21) Appl. No.: 13/417,404

(22) Filed: Mar. 12, 2012

(65) Prior Publication Data

US 2013/0234032 A1 Sep. 12, 2013

(51) Int. Cl.
*G01T 1/20* (2006.01)
(52) U.S. Cl.
CPC .............................. *G01T 1/20* (2013.01)
USPC ........................................................ 250/368

(58) Field of Classification Search
USPC ........................................................ 250/368
See application file for complete search history.

(56) References Cited

U.S. PATENT DOCUMENTS

| 4,824,194 A * | 4/1989 | Karasawa ..................... 385/146 |
| 7,928,383 B2 * | 4/2011 | Wang et al. .................. 250/310 |
| 2008/0061244 A1 * | 3/2008 | Adamec ........................ 250/368 |

* cited by examiner

*Primary Examiner* — David Porta
*Assistant Examiner* — Faye Boosalis
(74) *Attorney, Agent, or Firm* — WPAT, PC; Justin King

(57) ABSTRACT

An assembly for a charged particle detection unit is described. The assembly comprises a scintillator disc, a partially coated light guide a thin metal tube for allowing the primary charged particle beam to pass through and a photomultiplier tube (PMT). The shape of scintillator disc and light guide are redesigned to improved the light signal transmission thereafter enhance the light collection efficiency. A light guide with a conicoidal surface over an embedded scintillator improved the light collection efficiency of 34% over a conventional design.

26 Claims, 12 Drawing Sheets

Detector device in SEM

Detector device in SEM

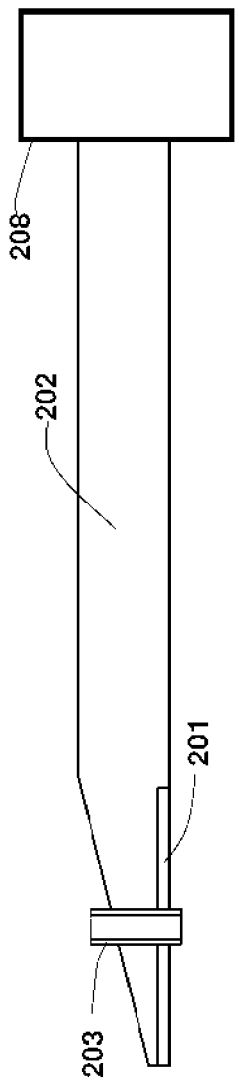
Figure 2A - Prior Art
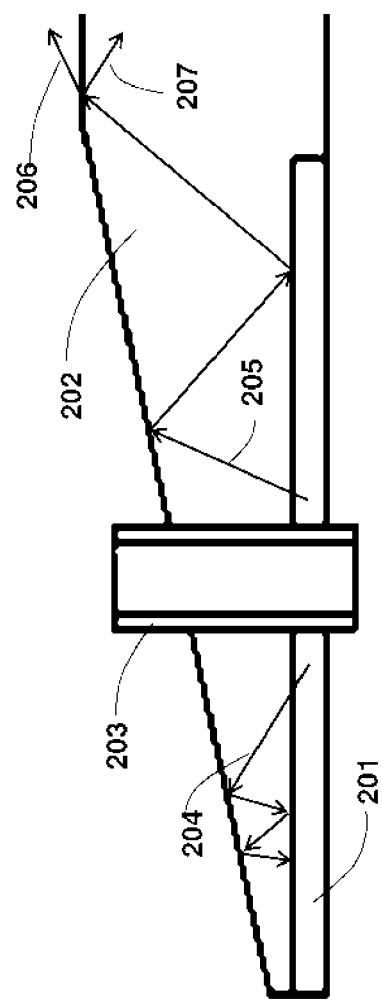
Figure 2B - Prior Art

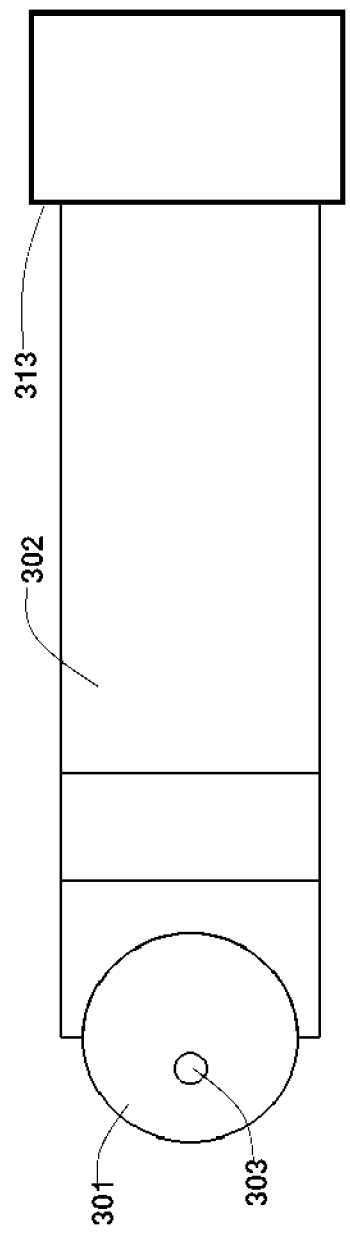
Figure 3A - Prior Art
Figure 3B - Prior Art

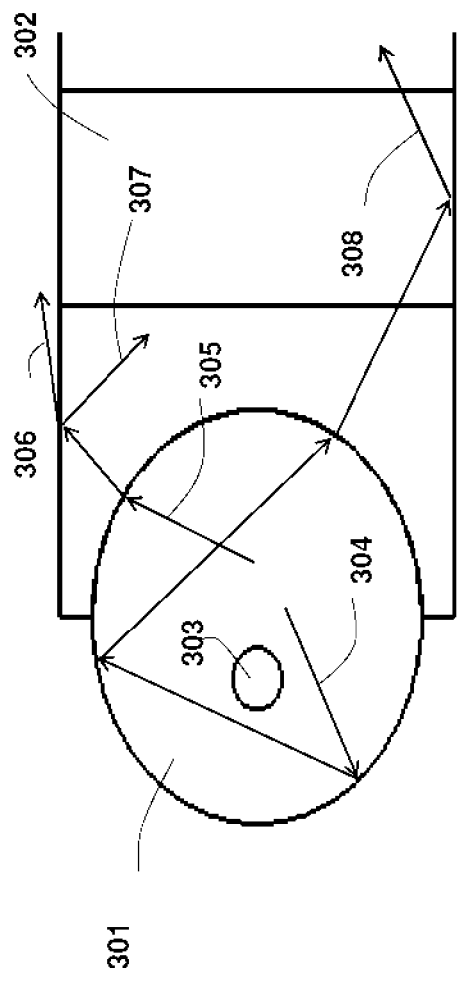
Figure 3C - Prior Art
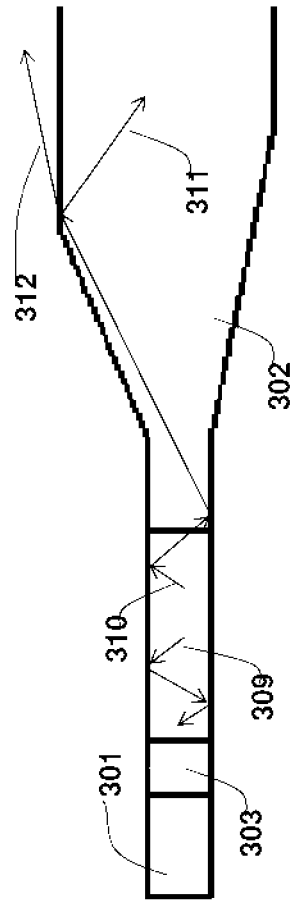
Figure 3D - Prior Art

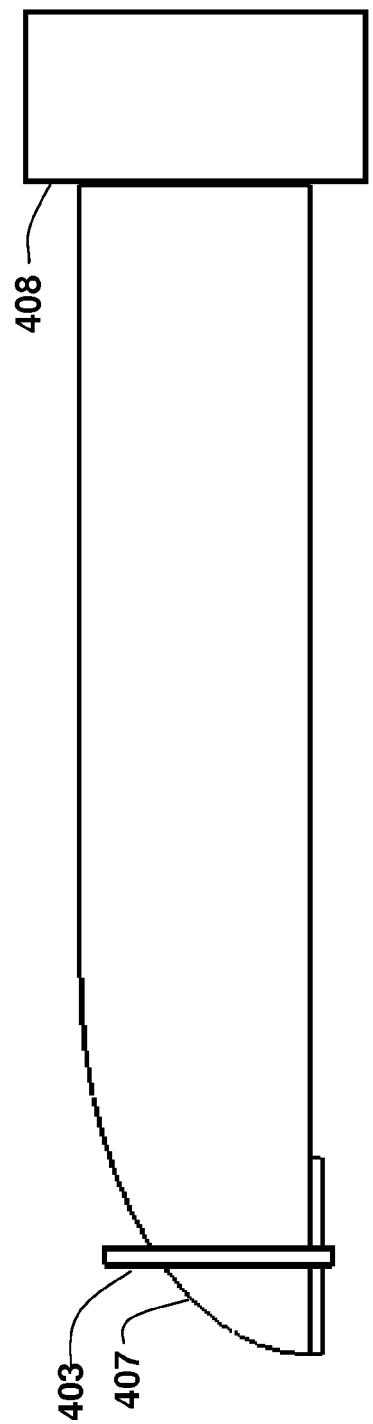
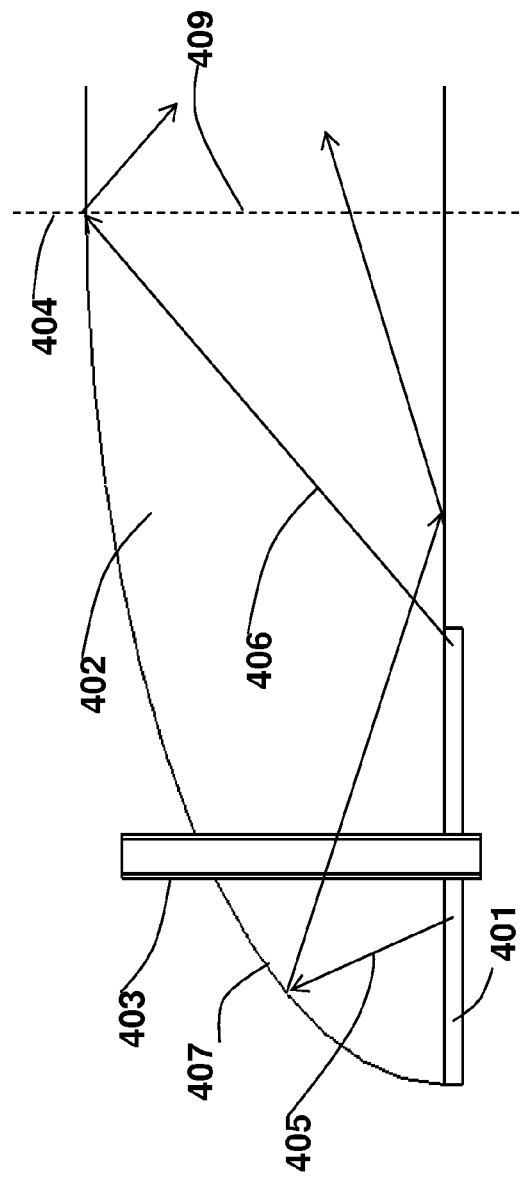
Figure 4A
Figure 4B

Figure 9 simulation results

| | Light guide shape | Scintillator disc shape | Assembly mode | Efficiency |
|---|---|---|---|---|
| Prior Art | Fig.2 | cylindrical | cohere | 13.79 % |
| | Fig.3 | cylindrical | cohere | 10.65 % |
| Present invention | Conicoid Fig.4 | cylindrical | cohere | 23.99 % |
| | Conicoid Fig.5 | truncated cone type | cohere | 40.33 % |
| | Conicoid Fig.6 | cylindrical | embedded | 47.42 % |
| | Conicoid Fig.7 | truncated cone type | embedded | 49.34 % |

US 8,895,935 B2

HIGH EFFICIENCY SECONDARY AND BACK SCATTERED ELECTRON DETECTOR

CROSS-REFERENCES TO RELATED APPLICATIONS

Not Applicable

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

FIELD OF THE INVENTION

The present invention relates to a charged particle detection device, more specifically, to a detection device that detecting backscattered electrons and secondary electrons emanating from substrate surface after being impinged by a charged particle beam.

BACKGROUND OF THE INVENTION

A charged particle detector is an indispensable part of a charged particle (ion or electron beam) instruments, for example, a scanning electron microscope (SEM). In a SEM, an electron beam emanated from an electron source is focused into a fine probe over a specimen surface and scanned by a deflection unit in a raster fashion; and signal electrons released from the specimen, including secondary electrons and back scattered electrons, are collected by charged particle detectors and the signal intensity is converted into the gray level of an image pixel corresponding to the location of the electron probe on the specimen surface. Scanning of the electron probe will then form a gray level mapping thus producing an image of the specimen surface.

There common used detectors in SEM are scintillator-photomultiplier tube (PMT) combination type (e.g. an Everhart-Thornley detector), semiconductor type, and microchannel plate type. The scintillator-PMT type, due to their high gain and low noise properties in respect to the semiconductor type and microchannel plate type, is more frequently used in a high resolution and low beam current SEM. Traditionally, this type of detector is consisting of a light guide, a scintillator disc is attached to the front face of the light guide, and the rare end of the light guide is coupled to a photomultiplier tube. Secondary electrons and backscattered electrons emit from sample surface impinged on scintillator disc and, in response, generate light signals. The light guide collects the light signal and directs it to PMT. In a conventional design, the electrons to light signal conversion efficiency and light signal collection are low. In order to compose an image with enough brightness and contrast, a large magnification PMT or magnifying circuit is needed, which will introduce a larger electric noise into the image. Since the electron to light conversion efficiency is depending on the chosen scintillator material, thereby, it is expected to improve efficiency of the light collection before the PMT.

FIG. 1 illustrates a typical SEM system with a prior art electron detection device that is positioned above objective lens. The SEM configure with an electron source 101, a gun lens 102, and objective lens 103. Primary electron beam 112 generate from electron source 101 moving along the optical axis 111 through the center hole 107 of the detection device 105 strike sample 104 surface. Backscattered and secondary electrons 106 caught by scintillator disc 108, are converted to light sight signal and are directed through light guide 109 to a PMT 110.

There were many scientists put their efforts on signal collecting efficiency improvement. For example, U.S. Pat. No. 6,211,525 by Cowham, described an electron-gathering light guide for collecting backscattered electrons, wherein the electron receptor has a concaved working surface. Cowham concave the electrons collecting surface design to improve the receiving efficiency.

U.S. Pat. No. 6,768,836 and U.S. Pat. No. 6,775,452 by Howells, waveguide of optical glass (reflective index=1.5) is re-designed so that backscattered and secondary electrons are detected by a phosphor deposited waveguide. All waveguide surfaces are polished to specularly reflect light impinging on surface.

U.S. Pat. No. 7,659,514 by Adamec, Adamec's design shape the scintillator disc surface to an ellipse or a parabola and set the opening (where primary electron beam passing through) on the focus of the ellipse or the parabola to enhance the light signal collection efficiency.

U.S. Pat. No. 6,545,277 by Kella et al., proposed a tent-like shape grid to compensate a "shadow" area created by the primary beam passing light-guide within the scintillator in order to enhance the detection efficiency of the secondary electrons.

U.S. Pat. No. 6,031,230 by Toumashu, provided a design for an SEM device which allows an optical microscope used to locate the specimen's position to have a large viewing angle and also enables the detection surface of the X-ray detector of the element analyzing device to have as wide solid angle and a viewing angle as possible with respect to the observation point on the specimen; and which allows the reflected electron detector to receive a large amount of reflective electrons from the specimen.

All these prior arts that mentioned above were emphasized on redesign the shape of scintillator disc to enhance light signal generating efficiency. The following discussion describes the disadvantages of conventional design. FIG. 2 illustrates an example of prior art electron detection device that the light guide is over the top of scintillator disc. An assembly shown in FIG. 2A for a detector includes a scintillator disc 201, a light guide 202 made of optical glass and a metal tube 203 to permit charged particle or for example electron beam to passing through. Backscattered and secondary electrons emit from specimen surface (not shown) strike the scintillator disc 201 and the impact point become a photon source that generating light signals or photons. The produced photons scatter to all directions from the impact point. Only photons, however for example, have a motion component moves toward right have chance to enter light guide 202 and thereafter be collected by PMT 208. Photons will loss part of its energy when crossing the boundary from one medium to another due to reflection at the boundary (Fresnel Loss). Only when the photon has a reflection angle greater than the critical angle of reflection of the boundary can perform total reflection without transmission to another medium and without energy loss. For example, the Fresnel Loss between air and most plastics and glass is about 4% at each boundary crossing; the critical angle of reflection between air and most plastics and glass is approximately 42°. Generally speaking, less than 50% of the scintillator produced photons can reach the PMT 208. Most of the produced photons are wasted, be adsorbed by scintillate disc and light guide, or transmit themselves away on the way to the PMT 208.

In FIG. 2B, 2 photons paths 204, 205 are indicated. The path 205 represents photons from the impact points that have component moving toward right. These photon arrive the front of PMT after several reflections along the light guide 202. In each reflection of the zigzag path toward PMT, the photon loss part of its energy due to different refractive index between light guide and air. As the FIG. 2B shows, due to the Fresnel Loss, the photon path 205 split into path 206 (refraction into air) and path 207 (reflection back to light guide), but only the reflected part 207 can be received by PMT. The path 204 represents photons from the impact points that have component moving toward left. The photons are moving toward the opposite side of the PMT along the light guide 202 will disperse into surrounding or be adsorbed by the light guide itself and have little contribution to light signal collection. To save the light signals which move to the opposite direction of the PMT, the light guide is usually coated with reflective material such as aluminum and the surface of light guide is polished to enhance reflection on the light guide surface.

FIG. 3 shows another example of prior art that light guide is connected to scintillator disc in series formation. An assembly shown in FIG. 3A for a detector comprises a scintillator disc 301, a light guide 302, a metal tube 303 for charged particle (i.e. electron) beam pass through, and a PMT 313. Back scattered and secondary electrons emit from specimen surface (not shown) strike the scintillator disc 301 the impact point become a photon source. The produced photons scatter to all directions from the impact point. Only photons, however for example, have a component move toward right have chance enter light guide 302 and thereafter be collected by PMT 313. The scintillator disc 301 is shaped as an ellipse and the metal tube 303 is located on one of the focus of the ellipse. The photons from the impact points that have component moving toward right, represents by path 305 of FIG. 3C, have chance to reach PMT 313 after tortuous reflection path within the light guide 302. The path 304 represents photons from the impact points that have component moving toward left. The photons moving to the left will finally be reflected back by the ellipse shaped surface, passing through the other focus of the ellipse and moving toward right as the photon path 305. Photons will loss its portion of energy in each reflection with an incident angle less than the critical angle due to the Fresnel Loss. Therefore photon's energy decay rapidly due to the tortuous path within scintillator disc 301 and light guide 302 before photon reach the PMT 313 as shown in FIG. 3C and FIG. 3D.

The present invention propose a new design of detection device including the shape of light guide and the shape of scintillator disc to enhance photons collecting efficiency.

SUMMARY OF THE INVENTION

A detection device for detecting backscattered electrons and secondary electrons induced by impinging charged particle beam comprising a scintillator disc, a light guide, a thin metal tube and a PMT; wherein the light guide with a conicoidal surface is cohered over the top of the scintillator disc and the light guide is cohered with or is mechanically attached to the PMT. The advantages of the detection device are: 1. the conicoidal portion of the light guide surface with reflective coating improves light collection efficiency by 10%; 2. the truncated-cone type scintillator disc improves light collection efficiency by 16%; 3. the embedded scintillator disc improves light collection efficiency by 23%; 4. the embedded truncated-cone type scintillator disc improves light collection efficiency by 25%; 5. the thin metal tube that made of a high permeability material to permit charged particle passing through can avoid stray electromagnetic field on the scintillator disc to affect passing primary beam.

In one embodiment the invention, the light collection efficiency is improved by shaping the surface of light guide over the top of the scintillator disc to a conicoidal type surface. Both the light guide and scintillator disc have a through hole to set the thin metal tube through which the primary charged particle beam passing through. On scintillator disc, the opening is located on the center; on light guide, the through hole is located between the vertex and one focus of the conicoid. The conicoidal surface of the light guide is coated with aluminum to improve internal light reflection. The surface of scintillator disc that endure electron impinging is also coated with aluminum to avoid charging effect.

In another embodiment the invention, further improvement of the light collection efficiency is achieved by shaping the scintillator disc into an upside-down truncated-cone with a slant angle larger than the critical angle of reflection between the scintillate material and vacuum interface beside the light guide with a conicoidal type surface over the top of the scintillator disc. Both the light guide and scintillator disc have a through hole to set the thin metal tube through which the primary charged particle beam passing through. On scintillator disc, the opening is located on the center; on light guide, the through hole is located between the vertex and one focus of the conicoid. The conicoidal surface of the light guide is coated with aluminum to improve internal light reflection. The surface of scintillator disc that endure electron impinging is also coated with aluminum to avoid charging effect.

In yet another embodiment the invention, the light collection efficiency improvement is achieved by embed a scintillator disc into a light guide with a conicoidal type surface over the top of the scintillator disc. The scintillator disc is manufactured to be cylindrical type. Both the light guide and scintillator disc have a through hole to set the thin metal tube through which the primary charged particle beam passing through. On scintillator disc, the opening is located on the center; on light guide, the through hole is located between the vertex and one focus of the conicoid. The conicoidal surface of the light guide is coated with aluminum to improve internal light reflection. The surface of scintillator disc that endure electron impinging is also coated with aluminum to avoid charging effect.

In yet another embodiment the invention, further improvement of the light collection efficiency is achieved by shaping the embedded scintillator disc into a truncated-cone with a slant angle smaller than the critical angle of reflection between the scintillate material and light guide interface beside the light guide with a conicoidal type surface over the top of the scintillator disc. Both the light guide and scintillator disc have a through hole to set the thin metal tube through which the primary charged particle beam passing through. On scintillator disc, the opening is located on the center; on light guide, the through hole is located between the vertex and one focus of the conicoid. The conicoidal surface of the light guide is coated with aluminum to improve internal light reflection. The surface of scintillator disc that endure electron impinging is also coated with aluminum to avoid charging effect.

The detection device for detecting secondary or back scattered electrons can be positioned away from the optical axis. The signal electrons are directed to the detection device by a Wien filter. The off optical axis detection device comprises a scintillator disc, a light guide with a conicoidal surface portion over the scintillator disc, and a PMT. The scintillator disc is cohered to the light guide or is embedded to the light guide. The center of the scintillator coincides with a focus of the conicoidal surface. The shape of the scintillator disc can be a cylindrical type or a truncated cone type with a slant angle smaller than the critical angle of reflection of scintillator disc/light guide interface (embedded type) or scintillator disc/air interface (direct-cohered type). The conicoidal surface of the light guide is coated with aluminum to improve internal light reflection. The surface of scintillator disc that endure electron impinging is also coated with aluminum to avoid charging effect.

BRIEF DESCRIPTION OF THE DRAWINGS

The present invention will be readily understood by the following detailed description in conjunction with the accompanying drawings, wherein like reference numerals designate like structural elements, and in which:

FIG. 2A is a schematic illustration of a conventional electron detection device that the light guide is over the top of scintillator disc.

FIG. 2B is a schematic illustration of light path analysis within the light guide of FIG. 2A.

FIG. 3A is a schematic illustration of another conventional design that light guide is connected to scintillator disc in series formation (top view).

FIG. 3B is a schematic illustration of another conventional design that light guide is connected to scintillator disc in series formation (side view).

FIG. 3C is a schematic illustration of light path analysis within the scintillator disc and the light guide of FIG. 3A (top view).

FIG. 3D is a schematic illustration of light path analysis within the scintillator disc and the light guide of FIG. 3B (side view).

FIG. 4A is a schematic illustration of the first embodiment of the present invention, a light guide of conicoidal surface over the top of a scintillator disc.

FIG. 4B is a schematic illustration of light path analysis within the light guide of FIG. 4A.

FIG. 9 illustrates the simulation result of light signal collection efficiency of an electron detection device with different scintillator disc shapes and light guide shapes design.

DETAILED DESCRIPTION OF THE INVENTION

Figure 1:
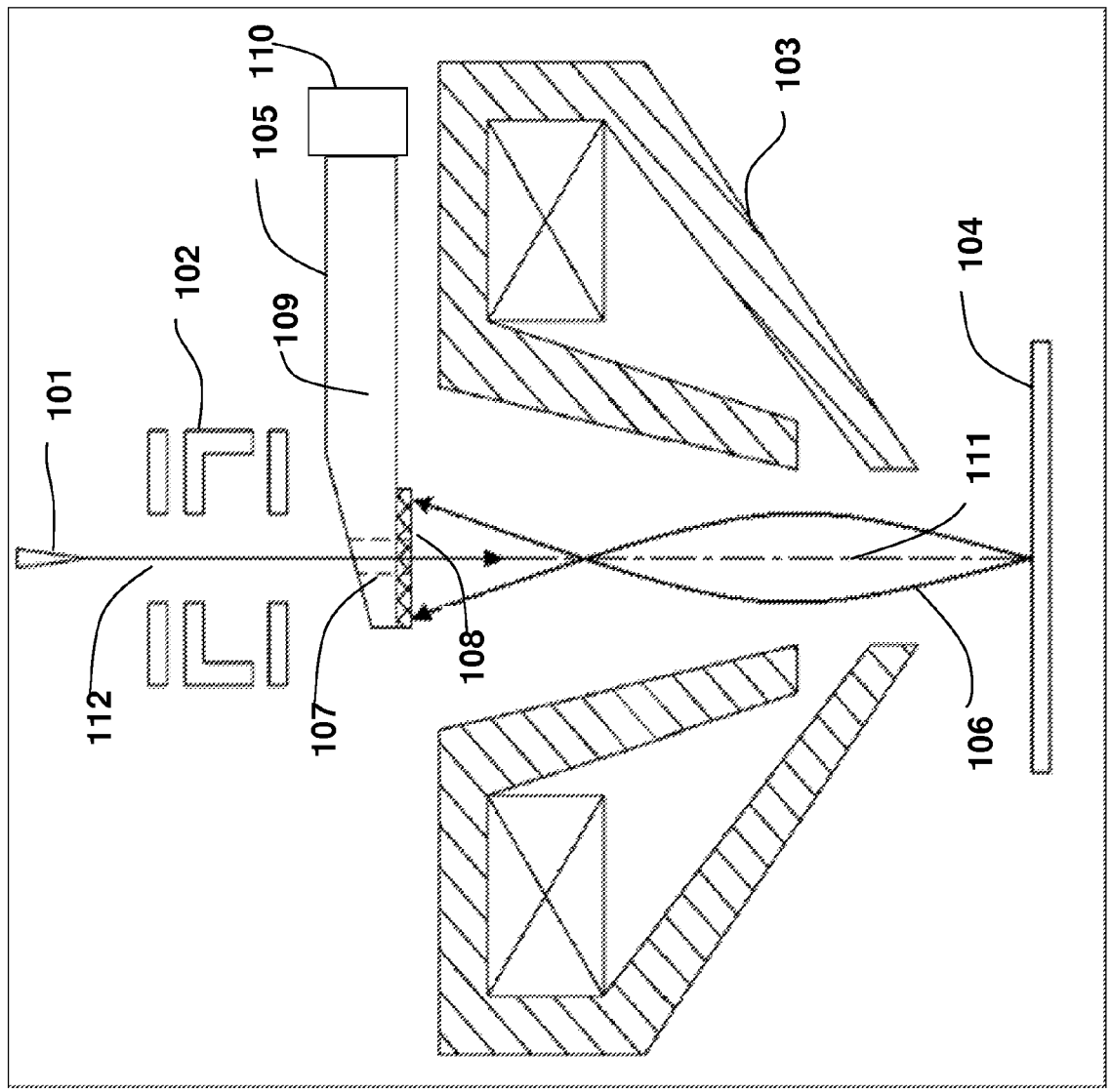
FIG. 1 is a schematic illustration of a typical SEM system with a prior art electron detection device that is positioned above objective lens.

Various example embodiments of the present invention will now be described more fully with reference to the accompany drawings in which some example embodiments of the invention are shown. Without limiting the scope of the protection of the present invention, all the description and drawings of the embodiments will exemplarily be referred to an electron source and scanning electron microscope. However, the embodiments are not be used to limit the present invention to specific charged particle sources and specific electron microscope field.

The descriptions below will focus on using electron beam, which is a kind of charged particles. In the drawings, relative dimensions of each component and among every component may be exaggerated for clarity. Within the following description of the drawings the same reference numbers refer to the same components or entities, and only the differences with respect to the individual embodiments are described.

Figure 4C:
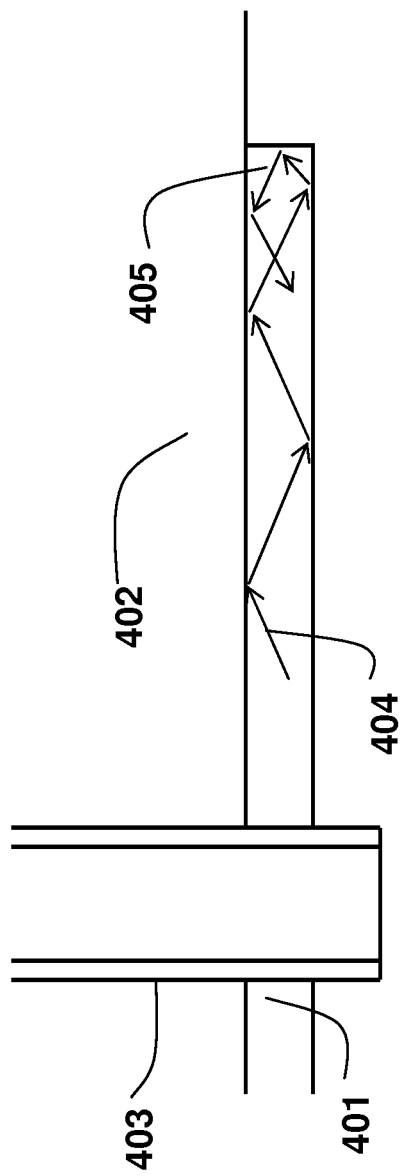
FIG. 4C is a schematic illustration of light path analysis within the scintillator disc of FIG. 4A.

The first embodiment of the present invention is illustrated in FIGS. 4A, 4B and 4C. A backscattered electron and secondary electron detection device comprises a scintillator disc 401, a light guide 402, a PMT 408, and a metal tube 403 for primary charged particle, e.g. electron, beam pass through. The light guide 402 is cohered over the top of the scintillator disc 401. The top front end surface 407 of light guide 402 is shaped to have a conicoidal type surface i.e. a paraboloid, an ellipsoid or a hyperboloid. The bottom surface of the light guide 402 is a flat plan. A preferred structure of the light guide is a rod with an ellipsoid upper left quarter followed by a horizontal portion as FIG. 4B illustrates. The location of scintillator disc 401 ensures that every photon from the scintillator disc 401 emanates between the focal point and the convex conicoidal surface 407. The design reduces the number of photon reflections by a photon moving toward PMT 408.

The photons generated by scintillator can be focused towards PMT 408, thus the photons collection efficiency can be enhanced evidently. A thin metal tube 403 made of high permeability material, for example permeability greater than 2000, is installed in the light guide for passing through of primary particle beam and to avoid stray electromagnetic field. The metal tube 403 is positioned such that the optical axis of the primary beam is coinciding with the center of the scintillator disc 401 and which is between the vertex and one focus of the conicoidal surface. The lower end of the metal tube 403 protrudes from bottom of the scintillator disc 401 in order to avoid the backscattered electrons and secondary electron that flying toward the scintillator disc 401 interfering the passing through primary beam. Both the light guide and scintillator disc have a through hole to set the thin metal tube through which the primary charged particle beam passing through. On scintillator disc, the opening is located on the center; on light guide, the through hole is located between the vertex and one focus of the conicoid. In FIG. 4B, the dash line 409 indicates the interface between the conicoidal surface 407 and the horizontal plan surface of light guide 402.

The conicoidal portion surface 407 of the light guide 402 is coated with aluminum to enhance reflection and reduce Fresnel Loss. And the surface of scintillator disc that endure electron impinging is also coated with aluminum to avoid charging effect. However, the coating should be thin enough without blocking out signal electrons to reach scintillator disc. A preferred coating thickness on the scintillator disc 401 is between 50 nm and 100 nm. No thickness preference for the coating outside the light guide. The representative light path 405 reflect at conicoidal surface 407 of the light guide 402 and forward to the other focus of the conicoid, the light will be total reflected at the bottom plan of light guide 402 because its incident angle is larger than the critical angle of light guide/vacuum interface. Generally speaking, after the photon (the light) pass through the dash line 409, the interface between the conicoidal surface and the horizontal plan surface, the photon will be total reflected without energy loss. Therefore, coating beyond the dash line 409, the interface between the conicoidal surface and the horizontal plan surface, is not necessary because the aluminum coating itself will absorb some photon energy (about 10%) during reflection process too.

FIG. 4C is an enlarged drawing of scintillator disc district of FIG. 4B. Since the scintillator disc 401 and light guide 402 have the different refractive indexes, Fresnel Loss happens when light emits from electron impact point crossing the scintillator/light guide interface. Part of the light refracts into light guide 402, part of the light reflects back to the scintillator disc 401 wherein the incident angle is smaller than the critical angle of the interface. When the incident angle is larger than the critical angle of the interface, the light is total reflected back to the scintillator disc 401 as the light path 404 and 405 indicate. The light into light guide 402 can be detected by PMT 408, on the contrary, the light trap in the scintillator 401 can not to be detected by PMT and decay rapidly in reflection and traveling process.

Figure 5A:
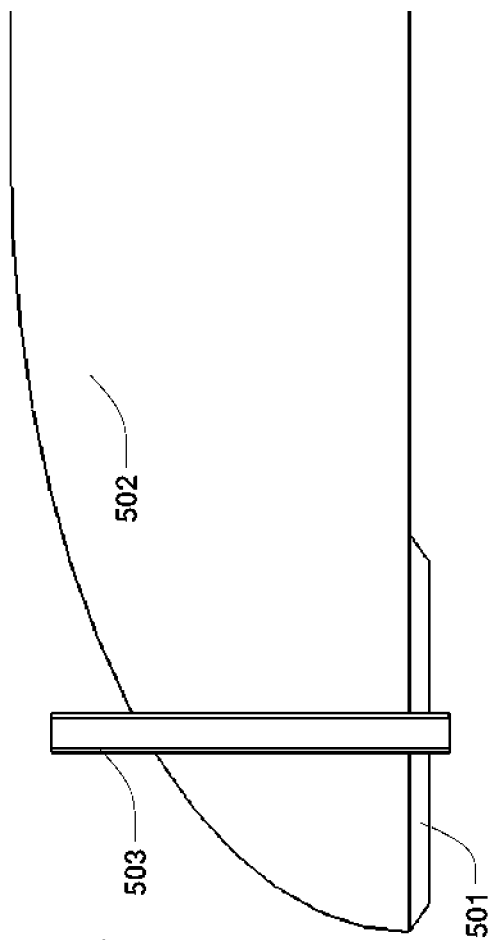
FIG. 5A is a schematic illustration of the second embodiment of the present invention, light guide with a conicoidal surface over the top of a truncated-cone type scintillator disc.
Figure 5B:
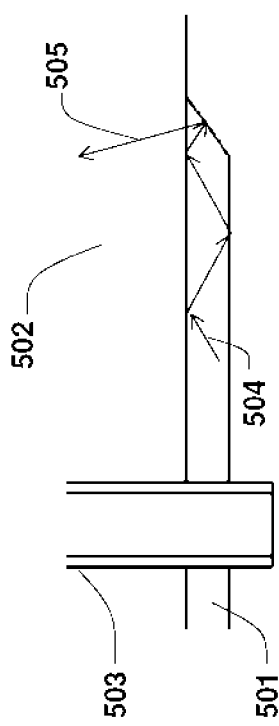
FIG. 5B is a schematic illustration of light path analysis within the scintillator disc of FIG. 5A.

Another embodiment of present invention is illustrated in FIGS. 5A and 5B. In order to improve the efficiency of photon transmission from scintillator disc to light guide, the edge of the scintillator disc is shaped to a non-vertical slant edge. The scintillator disc 501, shape like an upside-downed truncated-cone, with its bottom (larger) plan coheres to the light guide 502. A slant edge design will reflect the rebound light from the scintillator/light guide interface back to light guide 502 and thereafter enhance the photon transmission efficiency as the light path 505 indicates. However, preferred edge slop is that the light 504 reflected from the scintillator/light guide interface will has an incident angle respect to the edge plan larger than the critical angle between scintillator disc 501 and vacuum (approximately 42°), so that the reflected light path 505 can be a total reflection path. A preferred slant angle range of the upside-downed truncated-cone is between 40° and 90°. The side face of scintillator disc should be well polished to prevent diffuse reflection.

Figure 6A:
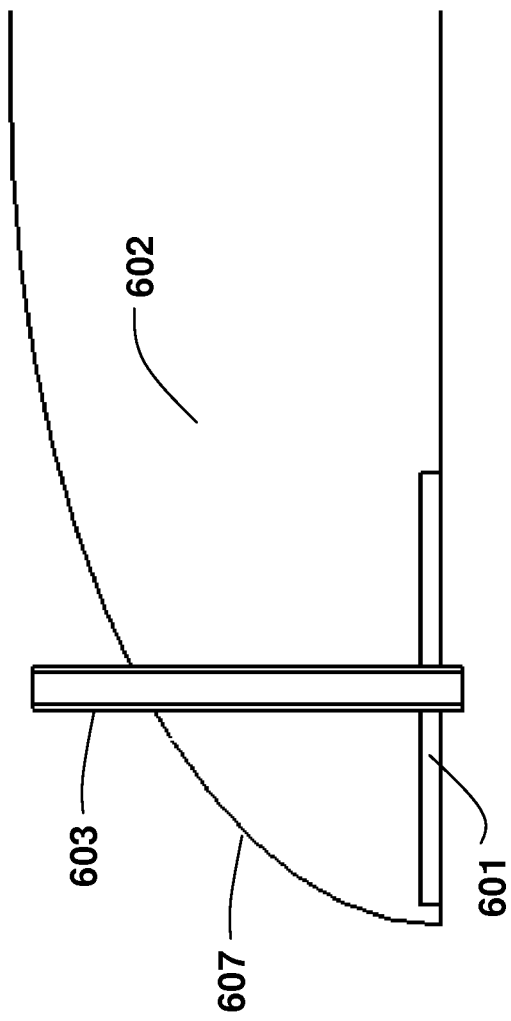
FIG. 6A is a schematic illustration of the third embodiment of the present invention, light guide with a conicoidal surface over the top of an embedded scintillator disc.
Figure 6B:
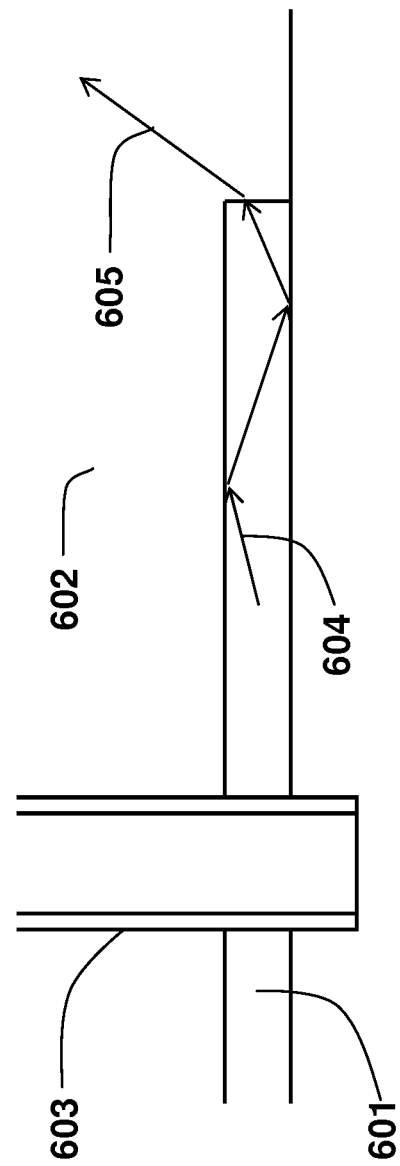
FIG. 6B is a schematic illustration of light path analysis within the scintillator disc of FIG. 6A.

FIGS. 6A and 6B illustrates a light guide design for improving photon transmission efficiency according to one embodiment of present invention. A cylindrical scintillator disc 601 is embedded into light guide 602 under the conicoidal surface portion. Both the light guide and scintillator disc have a through hole to set the thin metal tube through which the primary charged particle beam passing through. On scintillator disc, the opening is located on the center; on light guide, the through hole is located between the vertex and one focus of the conicoid. The conicoidal portion surface 607 of the light guide 602 is coated with aluminum to enhance reflection and reduce Fresnel Loss. And the surface of scintillator dice that endure electron impinging is also coated with aluminum to avoid charging effect. However, the coating should be thin enough without blocking out signal electrons to reach scintillator disc. A preferred coating thickness on the scintillator disc 601 is between 50 nm and 100 nm. No thickness preference for the coating outside the light guide.

All interfaces of the scintillator disc 601 are well polished such that the light reflects to the edge of the scintillator disc will refract across the edge interface and into the light guide 602 as the light path 604 indicates. Only a small percentage of the light which has an incident angle respect to the edge plan larger than the critical angle between scintillator disc 601 and the light guide 602 will be trapped in the scintillator and decay rapidly in reflection. The total light signal collection efficiency is improved.

Figure 7A:
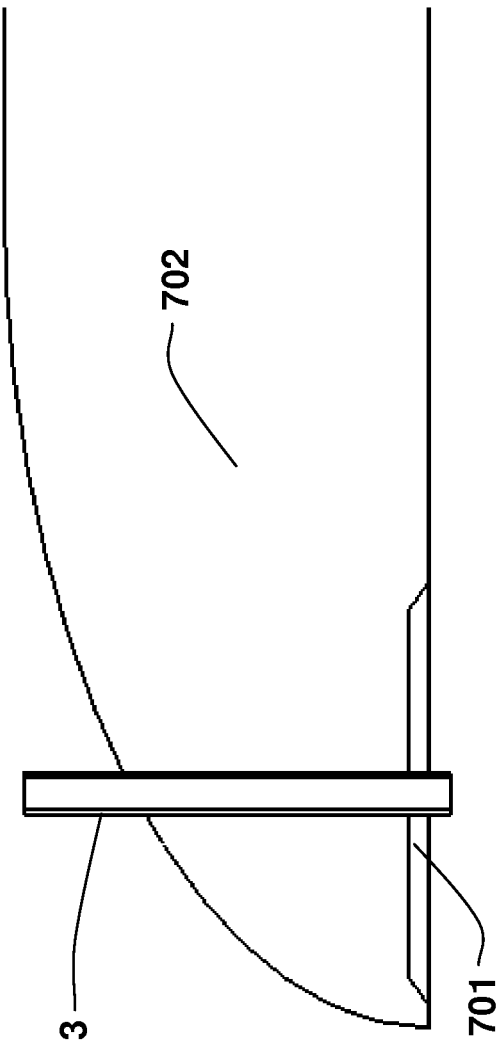
FIG. 7A is a schematic illustration of the fourth embodiment of the present invention, light guide with a conicoidal surface over the top of an embedded scintillator disc wherein the embedded scintillator disc is a truncated-cone type.
Figure 7B:
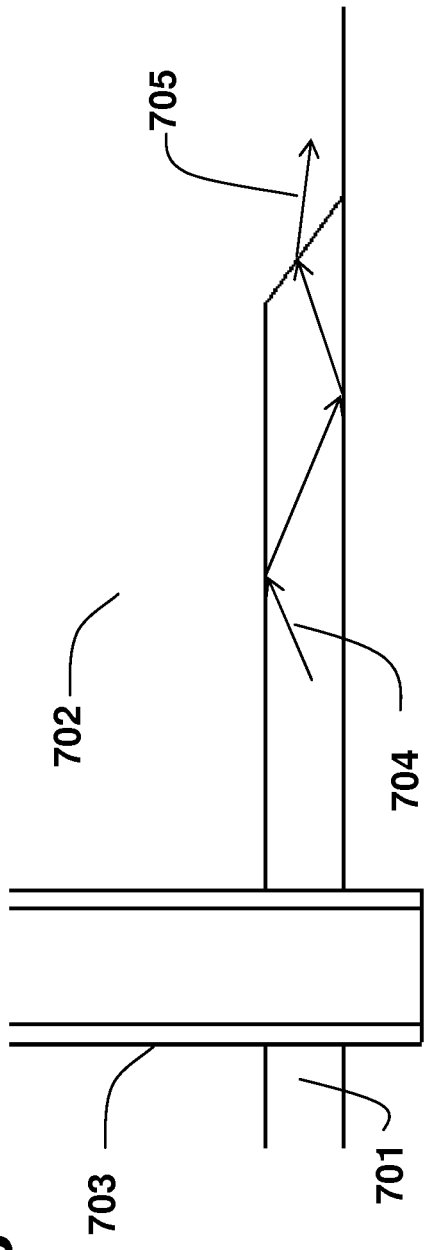
FIG. 7B is a schematic illustration of light path analysis within the scintillator disc of FIG. 7A.

And yet another embodiment of inventive light guide for improving efficiency is illustrated in FIGS. 7A and 7B. A normal truncated cone type scintillator disc 701 embedded into light guide 702 under the conicoidal surface portion such that the base of the normal truncated cone is the reception plan of electrons. Both the light guide and scintillator disc have a through hole to set the thin metal tube through which the primary charged particle beam passing through. On scintillator disc, the opening is located on the center; on light guide, the through hole is located between the vertex and one focus of the conicoid. All interfaces of the scintillator disc 701 are polished and a slant angle of the truncated cone is smaller than the critical angle between the scintillator disc/light guide interface (approximately 51°) to avoid total reflection. Thereafter, all light reflecting within the scintillator disc 701 as the light path 704 indicate well pass the slant interface into light guide 702 as the light path 704 indicate. The total light signal collection efficiency is enhanced. A preferred slant angle range of the normal truncated cone is between 0° and 51°.

In practice, refractive index and transmittance of the scintillator disc and the light guide are very important optical properties. The refractive index will determine the critical angle of total reflection of the scintillator disc/light guide interface; the transmittance will affect the thickness of scintillator disc and the length of light guide selection. In other words, the light generate by electrons impact scintillate material surface will be absorbed during traveling and reflecting in the scintillator disc and light guide. For example, a scintillate material YAP has a transmittance of 80% for 10 mm, which indicates that after traveling 70 mm in the scintillator disc the intensity of light is decayed to ⅕ of the original light.

Theoretically, a light heading toward an interface, only the incident angle smaller than the critical angle of the interface can transmit through the interface, the rest of the light will reflect back and decay during traveling. For example, an interface between YAP with a refractive index of 1.95 and a glass with a refractive index of 1.51, the intensity can be detected by PMT is about 37.1% of the original without considering absorption during light traveling. This inherent issue can only be soothed by properly choose the material of scintillator disc and light guide or alter the shape of the scintillator disc.

FIG. 9 is a simulation result of light signal collection efficiency of an electron detection device with different scintillator disc shapes and light guide shapes. The calculation of the simulation is based on a scintillate material with refractive index of 1.95, transmittance of 80% per 10 mm and a light guide material with refractive index of 1.51, transmittance of 99.7% per 10 mm. After introduce practical dimension of the scintillator disc and light guide and consider in reflection times, the light guide over the top of the scintillator disc has the superiority of 3% over the scintillator disc and light guide in series formation (FIG. 2 vs. FIG. 3). The light guide with conicoidal surface edges 10% over a flat surface light guide (FIG. 4 vs. FIG. 2). A reshaped scintillator disc with a near critical angle of reflection slant angle gains 16% over the one of cylindrical shape (FIG. 5 vs. FIG. 4). Embedding the scintillator in the light guide design improved the light signal collection efficiency by 23% (FIG. 6 vs. FIG. 4). Alter the shape of scintillator disc after embedded the scintillator disc in the light guide can provide another 2% total efficiency (FIG. 7 vs. FIG. 6).

The advantage of the present invention are the followings: 1. The conicoid type head of light guide can enhance light collection efficiency. 2. The embedded scintillator disc or truncated cone type scintillator disc can enhance light collection efficiency. 3. Thin metal tube with high magnetic conductivity can avoid stray electromagnetic field.

Figure 8A:
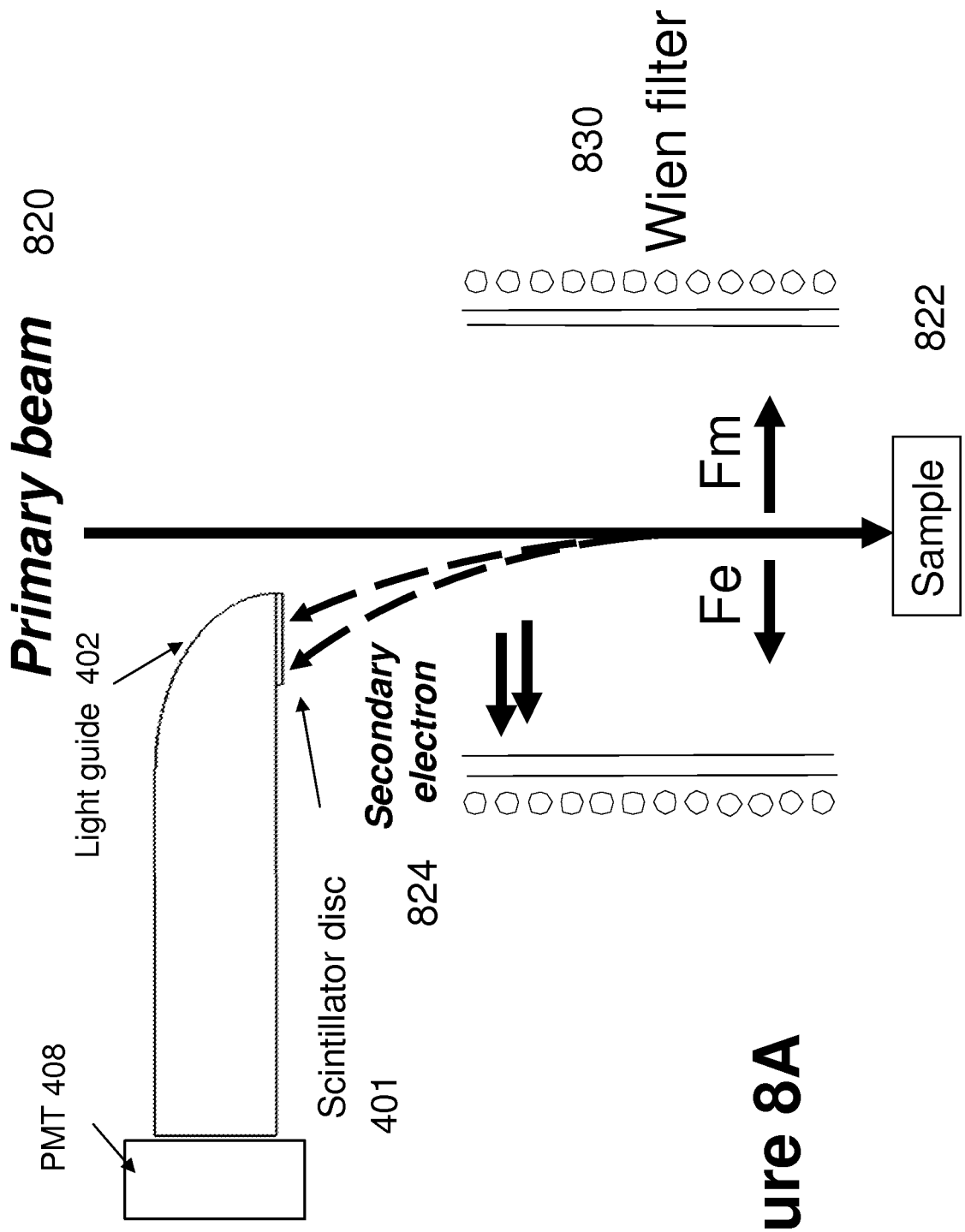
FIG. 8A is a schematic illustration of one example of the fifth embodiment of the present invention, detection device with a conicoidal surface light guide over the top of a scintillator disc is positioned away the primary beam.
Figure 8B:
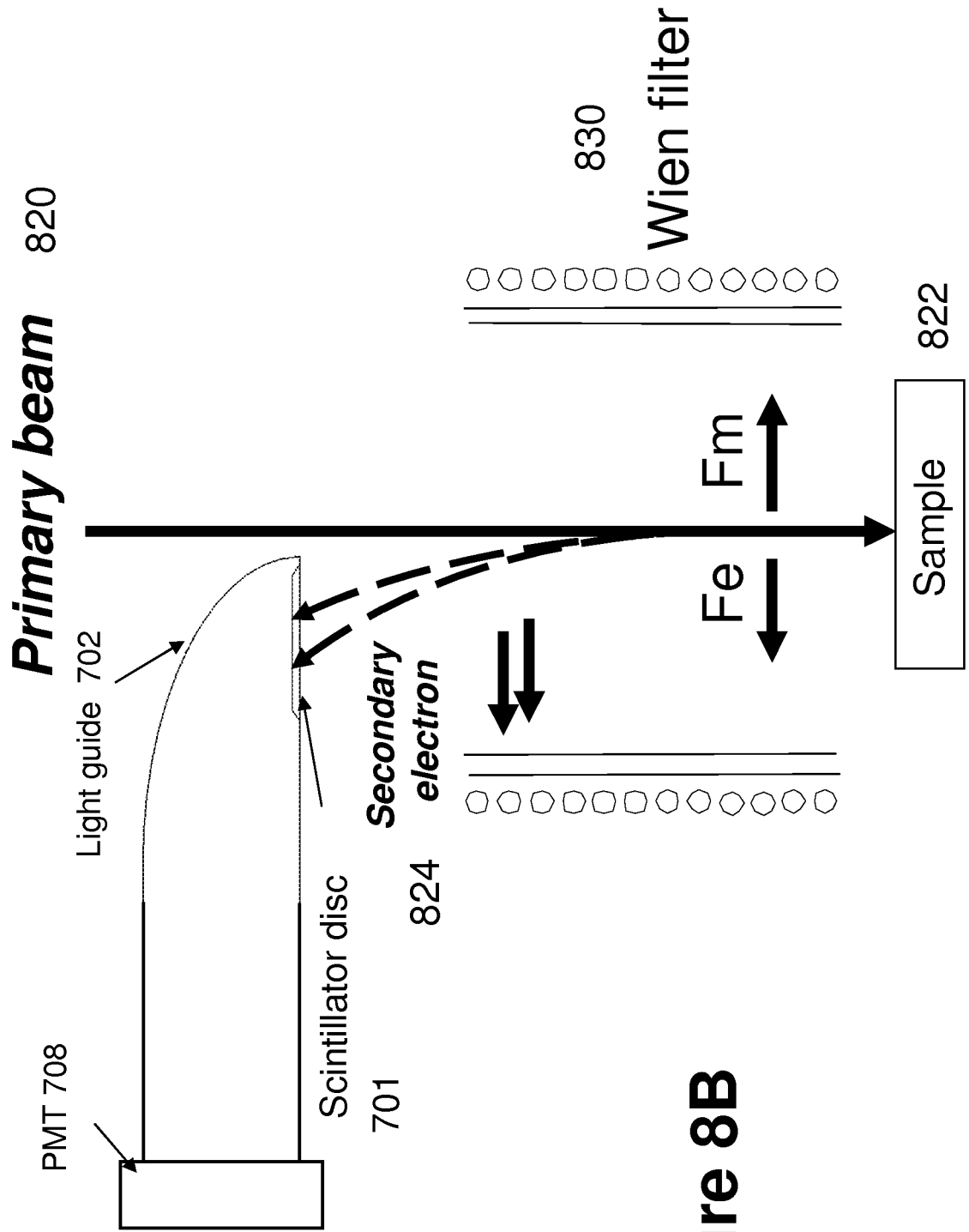
FIG. 8B is a schematic illustration of another example of the fifth embodiment of the present invention, detection device with a conicoidal surface light guide over the top of an embedded scintillator disc is positioned away the primary beam.

The detection device for detecting secondary or back scattered electrons can also be positioned away from the optical axis and primary charged particle beam as FIG. 8A illustrates. The incident primary charged particle beam 820 impinge sample 822 surface and induce signal electrons such as secondary electrons 824 or backscattered electrons. The secondary electrons 824 is directed to an off optical axis detection device by Wien filter 830. A Wien filter is a device consisting of perpendicular electric and magnetic fields that can be used as a velocity filter for charged particles. One may also vary the electric and magnetic fields in Wien filter to direct charged particles such as secondary electrons to a desired position. The detection device for detecting secondary or back scattered electrons away from the optical axis as illustrated in FIGS. 8A and 8B comprises a scintillator disc, a light guide with a conicoidal surface portion over the scintillator disc, and a PMT. The scintillator disc is cohered to the light guide as FIG. 8A indicates or is embedded to the light guide as FIG. 8B indicates. It is preferable to have the center of the scintillator coincides with a focus of the conicoidal surface. For example, for a paraboloid surface, a photon from the focal point will travel parallel to center axis after reflection. This imply that no extra reflection before the photo reach PMT.

The shape of the scintillator disc can be a cylindrical type or a truncated cone type with a slant angle. For example, the slant angle is smaller than the critical angle of reflection of scintillator disc/vacuum interface when the scintillator disc is direct-cohered to the light guide and the slant angle is smaller than the critical angle of reflection of scintillator disc/light guide interface when the scintillator disc is embedded in the light guide. The conicoidal surface of the light guide is coated with aluminum to improve internal light reflection. And the surface of scintillator disc that endure electron impinging is also coated with aluminum to avoid charging effect. However, the coating should be thin enough without blocking out signal electrons to reach scintillator disc. A preferred coating thickness on the scintillator disc is between 50 nm and 100 nm.

What is claimed is:

1. A charged particle detection device, comprising:
    a scintillator disc, with a center hole, to collect and convert received charged particles into photons;
    a light guide, to transmit said photons, comprising:
        a conicoidal surface portion;
        a plan surface portion; and
        a through hole;
    a metal tube, for permitting a charged particle beam to pass through; and
    a photomultiplier tube (PMT), cohered with the end of said light guide to receive said photons from said light guide.

2. The charged particle detection device of claim 1, wherein the center hole of the scintillator disc, the through hole of the light guide and the center of the metal tube are aligned with the passing charged particle beam.

3. The charged particle detection device of claim 1, wherein said metal tube is made of a material of relative magnetic permeability greater than 2000.

4. The charged particle detection device of claim 1, wherein the scintillator disc is cohered to the light guide under the conicoidal surface portion and the shape of the scintillator disc is cylindrical type.

5. The charged particle detection device of claim 1, wherein the scintillator disc is cohered to the light guide under the conicoidal surface portion and the shape of the scintillator disc is an upside-down truncated-cone type with a slant edge.

6. The charged particle detection device of claim 5, wherein the slant edge of the scintillator disc has a slant angle between 40° and 90°.

7. The charged particle detection device of claim 1, wherein the scintillator disc is fully embedded in the light guide under the conicoidal surface portion and the shape of the scintillator disc is cylindrical type.

8. The charged particle detection device of claim 1, wherein the scintillator disc is fully embedded in the light guide under the conicoidal surface portion and the shape of the scintillator disc is a truncated-cone type with a slant edge.

9. The charged particle detection device of claim 5, wherein the slant edge of the scintillator disc has a slant angle between 0° and 51°.

10. The charged particle detection device of claim 1, wherein the conicoidal surface portion of the light guide is coated with aluminum.

11. The charged particle detection device of claim 1, wherein an electron-entry surface of said scintillator disc is coated with aluminum.

12. The charged particle detection device of claim 1, wherein the conicoidal surface portion of the light guide is part of an ellipsoid surface.

13. The charged particle detection device of claim 1, wherein the conicoidal surface portion of the light guide is part of a hyperboloid surface.

14. The charged particle detection device of claim 1, wherein the conicoidal surface portion of the light guide is part of a paraboloid surface.

15. A charged particle detection device, comprising:
    a scintillator disc, to collect and convert received charged particles into photons;
    a light guide, to transmit said photons, comprising:
        a conicoidal surface portion; and
        a plan surface portion; and
    a photomultiplier tube (PMT), cohered with the end of said light guide to receive said photons from said light guide;
    wherein said charged particles are directed to said scintillator disc by a Wien filter.

16. The charged particle detection device of claim 15, wherein the scintillator disc is cohered to the light guide under the conicoidal surface portion and the shape of the scintillator disc is cylindrical type.

17. The charged particle detection device of claim 15, wherein the scintillator disc is cohered to the light guide under the conicoidal surface portion and the shape of the scintillator disc is an upside-down truncated-cone type with a slant edge.

18. The charged particle detection device of claim 17, wherein the slant edge of the scintillator disc has a slant angle between 40° and 90°.

19. The charged particle detection device of claim 15, wherein said scintillator disc is fully embedded in said light guide under said conicoidal surface portion and said scintillator disc has a cylindrical type shape.

20. The charged particle detection device of claim 15, wherein said scintillator disc is fully embedded in said light guide under said conicoidal surface portion and said scintillator disc has a truncated-cone type shape with a slant edge.

21. The charged particle detection device of claim 20, wherein the slant edge of the scintillator disc of has a slant angle between 0° and 51°.

22. The charged particle detection device of claim 15, wherein the conicoidal surface portion of the light guide is coated with aluminum.

23. The charged particle detection device of claim 15, wherein an electron-entry surface of said scintillator disc is coated with aluminum.

24. The charged particle detection device of claim 15, wherein the conicoidal surface portion of the light guide is part of an ellipsoid surface.

25. The charged particle detection device of claim 15, wherein the conicoidal surface portion of the light guide is part of a hyperboloid surface.

26. The charged particle detection device of claim 15, wherein the conicoidal surface portion of the light guide is part of a paraboloid surface.

* * * * *